US008155905B2

(12) United States Patent
Miki

(10) Patent No.: US 8,155,905 B2
(45) Date of Patent: Apr. 10, 2012

(54) METHOD OF EXTRACTING A TIME CONSTANT FROM COMPLEX RANDOM TELEGRAPH SIGNALS

(75) Inventor: Hiroshi Miki, White Plains, NY (US)

(73) Assignee: Hitachi, Ltd., Tokyo (JP)

( * ) Notice: Subject to any disclaimer, the term of this patent is extended or adjusted under 35 U.S.C. 154(b) by 447 days.

(21) Appl. No.: 12/506,646

(22) Filed: Jul. 21, 2009

(65) Prior Publication Data

US 2011/0022339 A1    Jan. 27, 2011

(51) Int. Cl.
*G01R 13/00* (2006.01)
*G06F 17/18* (2006.01)
(52) U.S. Cl. ........... 702/66; 257/314; 365/195; 702/180
(58) Field of Classification Search .......... 702/64, 702/66, 180; 257/314; 324/762.09; 365/195, 365/222; 703/13; 375/224
See application file for complete search history.

(56) References Cited

U.S. PATENT DOCUMENTS

| 7,450,458 | B2 | 11/2008 | Mori et al. |
| 7,468,924 | B2 | 12/2008 | Kwon |
| 2001/0048128 | A1 | 12/2001 | Yano et al. |
| 2005/0043908 | A1 | 2/2005 | Bhavnagarwala et al. |
| 2007/0192077 | A1 | 8/2007 | Kim et al. |
| 2008/0030220 | A1 | 2/2008 | Agarwal et al. |
| 2010/0098143 | A1* | 4/2010 | Kitagaki ........................ 375/224 |

OTHER PUBLICATIONS

Kolhatkar et al., "Separation of Random Telegraph Signals form 1/f Noise in MOSFETs under Constant and Switched Bias Conditions;" 33rd Conference on European Solid-State Device Research 2003, ESSDERC '03; Sep. 2003; pp. 549-552.
Keshavarzi et al., "Measurements and Modeling of Intrinsic Fluctuations in MOSFET Threshold Voltage;" Proceedings of the 2005 Low Power Electronics and Design, ISLPED '05; Aug. 2005; pp. 26-29.
Konczakowska et al., "A New Method for RTS Noise of Semiconductor Devices Identification," IEEE Transactions on Instrumentation and Measurement, vol. 57, No. 6; Jun. 2008; pp. 1199-1206.
Konczakowska et al., "A new method for identification of RTS noise," Bulletin of the Polish Academy of Sciences, Technical Sciences, vol. 54, No. 4, 2006; pp. 457-460.
Y. Yuzhelevski et al., "Random Telegraph Noise Analysis in Time Domain", Review of Scientific Instruments, vol. 71, No. 4, Apr. 2000, pp. 1681-1688.
G. Giusi et al., "An Algorithm for Separating Multilevel Random Telegraph Signal from 1/f Noise", Review of Scientific Instruments, vol. 79, 2008, pp. 024701-1 to 024701-5.

* cited by examiner

*Primary Examiner* — John H Le
(74) *Attorney, Agent, or Firm* — Miles & Stockbridge P.C.

(57) ABSTRACT

A method and apparatus for extracting a time constant from a time series of values of a signal that varies in accordance with multiple charge carrier trap defects that cause Random Telegraph Noise (RTN), using transition-based assignment of states.

20 Claims, 18 Drawing Sheets

FIG. 15

Previous = "1111"

| Next bin# | Assignment |
|---|---|
| 1023 | 1111 |
| 1022 | 1111 |
| 1021 | 1111 |
| 1020 | 1111 |
| 1019 | 1111 |
| 1018 | 1111 |
| 574 | 0111 |
| 573 | 0111 |
| 572 | 0111 |
| 571 | 0111 |
| 570 | 0111 |
| 569 | 0111 |
| 4 | 0111 |
| 3 | 0111 |
| 2 | 0111 |
| 1 | 0111 |
| 0 | 0111 |

Previous = "0110"

| Next bin# | Assignment |
|---|---|
| 1023 | 1110 |
| 1022 | 1110 |
| 1021 | 1110 |
| 1020 | 1110 |
| 1019 | 1110 |
| 1018 | 1110 |
| 574 | 0111 |
| 573 | 0111 |
| 572 | 0111 |
| 571 | 0111 |
| 570 | 0111 |
| 569 | 0111 |
| 4 | 0010 |
| 3 | 0010 |
| 2 | 0010 |
| 1 | 0010 |
| 0 | 0010 |

Previous = "0000"

| Next bin# | Assignment |
|---|---|
| 1023 | 1000 |
| 1022 | 1000 |
| 1021 | 1000 |
| 1020 | 1000 |
| 1019 | 1000 |
| 1018 | 1000 |
| 574 | 1000 |
| 573 | 1000 |
| 572 | 0100 |
| 571 | 0100 |
| 570 | 0100 |
| 569 | 0100 |
| 4 | 0000 |
| 3 | 0000 |
| 2 | 0000 |
| 1 | 0000 |
| 0 | 0000 |

METHOD OF EXTRACTING A TIME CONSTANT FROM COMPLEX RANDOM TELEGRAPH SIGNALS

FIELD OF THE INVENTION

Embodiments of the present invention relate generally to detection of defects in semiconductor devices and, in particular, to methods for detecting of multiple defects in semiconductor devices.

BACKGROUND

Mobile charge carrier traps present in a semiconductor device can affect the reliability of the device and cause yield losses in the manufacturing of such semiconductor devices. As such, mobile charge carrier trap defects can adversely impact the performance and manufacturing cost of semiconductor devices. For example, mobile charge carrier trap defects can cause aperiodic Random Telegraph Noise (RTN) to be present in the threshold voltages of the semiconductor device, thus altering the device's operating characteristics such as, for example, switching voltage or current thresholds.

Conventionally, RTN has been thought to be an elementary noise in 1/f (e.g., flicker) noise. If an active volume of a device is small enough to allow only one defect per semiconductor device, the noise has a binary waveform, the binary two states of which correspond to the two states of the single defect in the device. For example, FIGS. 1A and 1B illustrate the physical origin and statistical nature of RTN in a Metal Oxide Semiconduct Field Effect Transistor (MOSFET) device. As shown in FIGS. 1A and 1B, the capture and emission of an electron at a trap near a silicon-insulator interface results in bistable alternation (increase and decrease, respectively) of the threshold voltage (Vth) of the MOSFET.

When the active volume is further reduced, the probability of finding the defect in a device is correspondingly lowered. On the other hand, it is statistically inevitable that a given device will have two or more such trap defects.

In addition, a defective device shows extremely singular characteristics if the active volume is small enough for the change of states of the defects to significantly affect the operation of the device. As a result, the complex RTN case is widely accepted as a major cause of yield loss, especially in flash memory devices.

In view of the practical importance of detecting complex RTN defects, a robust procedure for analyzing and determining the complex RTN characteristics is desirable. Conventional techniques directed to quantitative extraction of the physical constants of RTN are limited in scope to simple, one-defect RTN. The effects of Gaussian noise on the measured signal can also cause difficulty in reliably distinguishing the presence of multi-trap defects.

SUMMARY

The present invention is, in its various embodiments, an apparatus and method for characteristic physical constant extraction for determining multiple trap defects in a semiconductor device, including receiving a signal representing a change in a drain current of the semiconductor device over time, the signal comprising a time series of values; constructing a histogram representation of the signal by binning each value; determining a plurality of peaks of the histogram representation, each peak being associated with a state of a Random Telegraph Noise (RTN) signal caused by a plurality of bistable traps of mobile charge carriers in the semiconductor device; assigning a peak index value for each peak; calculating an amplitude and a time constant ratio for each trap; determining theoretical intensities for each peak; and determining a number of traps based on a correspondence between the calculated amplitude and time constant ratio for each trap and the theoretical intensity for each peak associated with each trap.

Embodiments of an apparatus for extracting characteristic physical constants from a complex Random Telegraph Noise (RTN) signal includes a first stage configured to resolve a number of stable states in a time series, the stable states being associated with a plurality of defects, the time series comprising a plurality of data points, and the first stage also configured to determine an activation status of each defect; and a second stage configured to calculate a transition preference table based on physically allowed transitions, and to uniquely assign each data point of the time series to one of the stable states using the transition preference table, each defect comprising a bistable trap of a mobile charge carrier in the semiconductor device, and the plurality of defects causing Random Telegraph Noise (RTN) in a voltage threshold of one or more gates of the semiconductor device.

BRIEF DESCRIPTION OF THE DRAWINGS

The utility, objects, features, and advantages of the present invention will be readily appreciated and understood from consideration of the following detailed description of the embodiments of this invention, when taken with the accompanying drawings, in which:

FIG. 15 is an illustration of an example of an allowed state transition look-up table output and stored according to various embodiments;

DETAILED DESCRIPTION

Embodiments relate to systems and methods for detecting multiple trap defects in semiconductor devices. In particular, the present invention relates to a method of extracting and determining characteristic physical constants of random telegraph noise (RTN), especially when the RTN is so-called "complex" RTN which is produced by two or more defects, and an apparatus for performing the method.

Figure 1B:
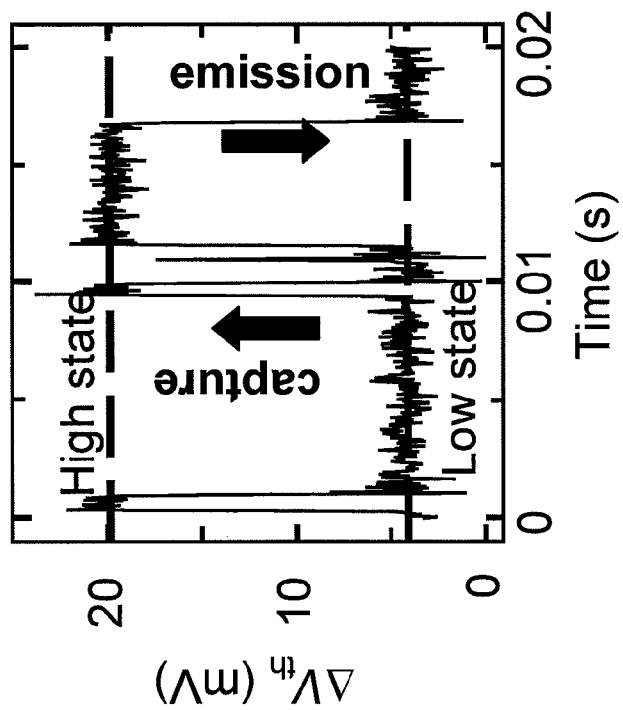
FIGS. 1A and 1B illustrate the physical origin and statistical nature of RTN in a Metal Oxide Semiconduct Field Effect Transistor (MOSFET) device.
Figure 1A:
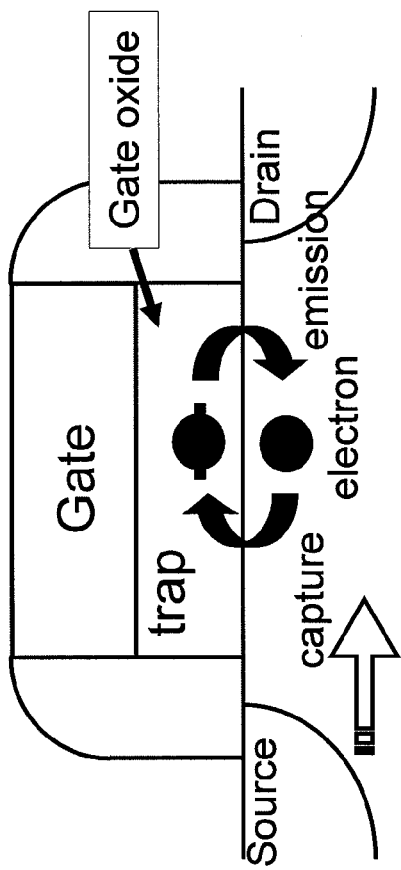
Figure 2:
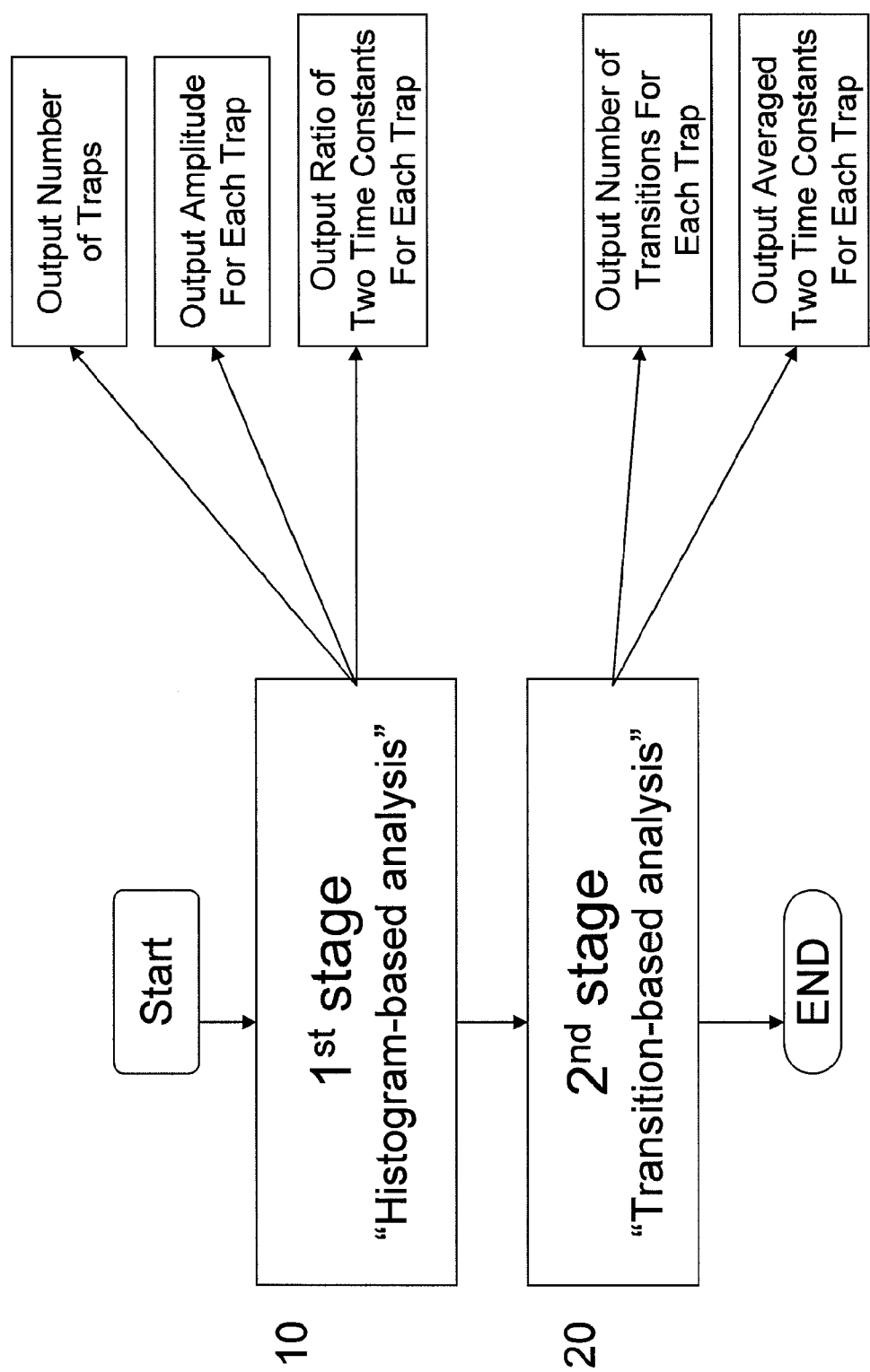
FIG. 2 is a top-level flowchart of a two-stage RTN detector method according to various embodiments.

In various embodiments of the present invention, the detection of RTN is performed in at least one of two stages. For example, FIG. 2 is a top-level flowchart of a two-stage RTN detector method according to various embodiments. Referring now to FIG. 2, at the first stage 10, a number of stable states in a time series is resolved along with the activated/deactivated status of each defect. In particular, the first stage can determine and output the number of traps, the amplitude for each trap, and the ratio of two time constants for each trap. A histogram analysis is utilized in this stage. At the second stage 20, each data point on the time series is assigned to the stable states defined in the previous stage. In particular, the second stage can determine and output the number of transitions for each trap and the averaged two time constants for each trap. Physics-based consideration of transitions is deployed to uniquely assign the high and low states to holding values even when Gaussian noise distorts the time series. In particular, a transition preference table is calculated for each physically allowed transition. In this way, embodiments greatly enhance the uniqueness of the assignment of state.

Figure 3B:
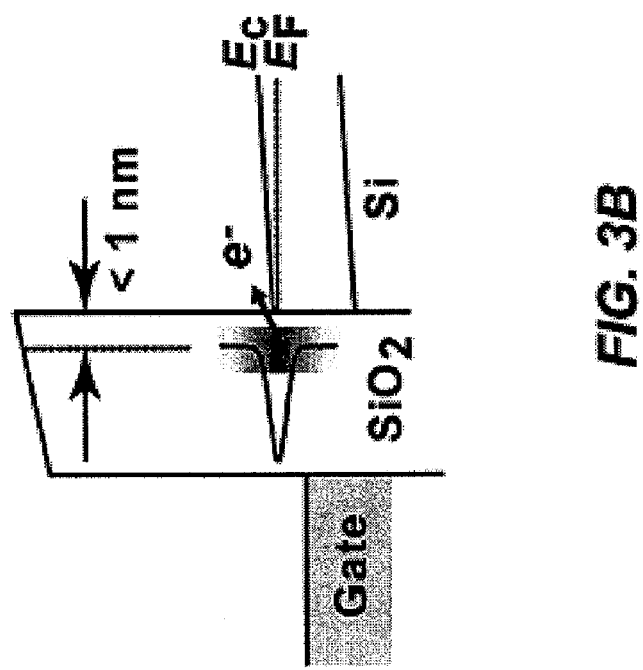
FIGS. 3A and 3B illustrate information obtained by extracting a time constant according to various embodiments.
Figure 3A:
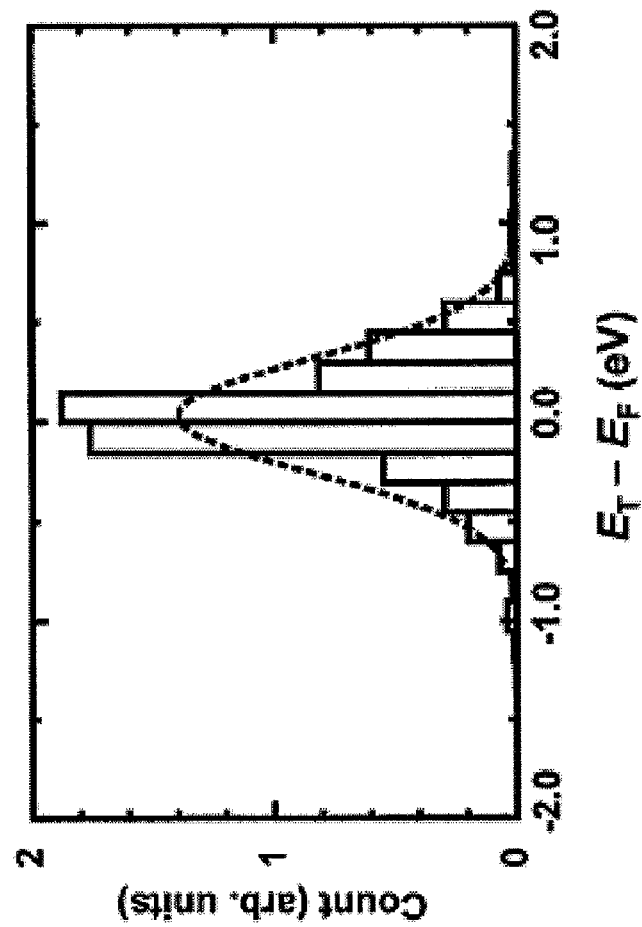

For example, the information provided by device time constant information is illustrated in FIGS. 3A and 3B. Referring to FIGS. 3A and 3B, according to various embodiments, the ratio of capture and emission time is determined by:

$$<\tau_e>/<\tau_c> = g \exp(-(E_T-E_F)/kT)$$ Eq. 1 where $\tau_e$ is the emission time for electrons, $\tau_c$ is the capture time for electrons, g is the degeneracy factor of the trap, $E_T$ is the energy level of the trap, $E_F$ is the Fermi Energy, k is the Boltzmann constant, and T is the temperature. Angle brackets mean that the quantity is obtained after averaging.

In addition, temperature dependence information can provide the energy distribution of traps present in the semiconductor device. From this, it can be determined the physical origin of the defect (for example, oxygen vacancy, metal inpurity, electrical stress). Thus, time constant information is a powerful tool to determine the root cause of yield loss in the manufacturing of semiconductor devices.

Figure 4:
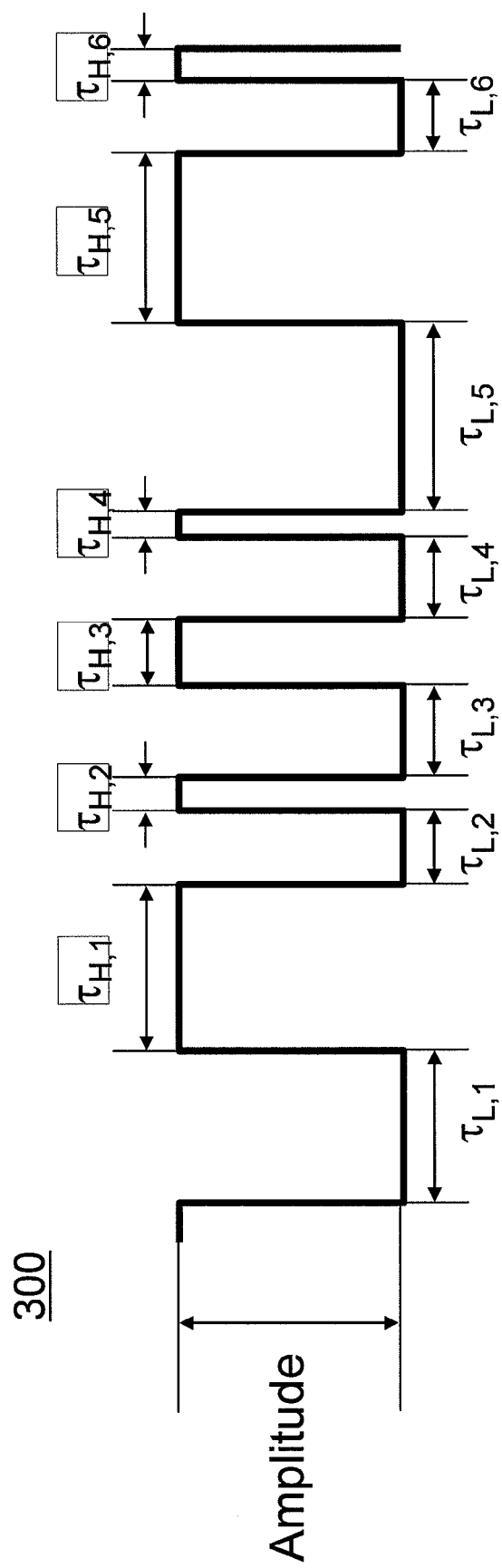
FIG. 4 is an exemplary time series waveform from which time constant information can be extracted, according to various embodiments.

For illustration, FIG. 4 is an example of a time series 300 from which time constant information can be extracted to determine the energy distribution of trap defects, according to various embodiments. Referring to FIG. 4, the holding times at the high state, $\tau_{H,1}, \tau_{H,2}, \ldots$, of the waveform 300 are described by an exponential distribution. Similarly the holding times at the low state, $\tau_{L,1}, \tau_{L,2}, \ldots$, of the waveform 300 also follow the exponential distribution. This is because the transition between the high and low states is a "memoryless" (i.e., Markov) process. Thus, the cumulative distribution function is given by:

$$F(t) = 1 - \exp(-\lambda t)$$ Eq. 2 where $\lambda$ is a rate constant given be $1/<\tau>$ and $<\tau>$ is either $<\tau_H> = \Sigma \tau_{H,i}/n$ or $<\tau_L> = \Sigma \tau_{L,i}/n$, and n is the number of holding events at either state during observation.

In other words, the arithmetic mean provides the reciprocal of the transition probability per unit time.

Figure 5:
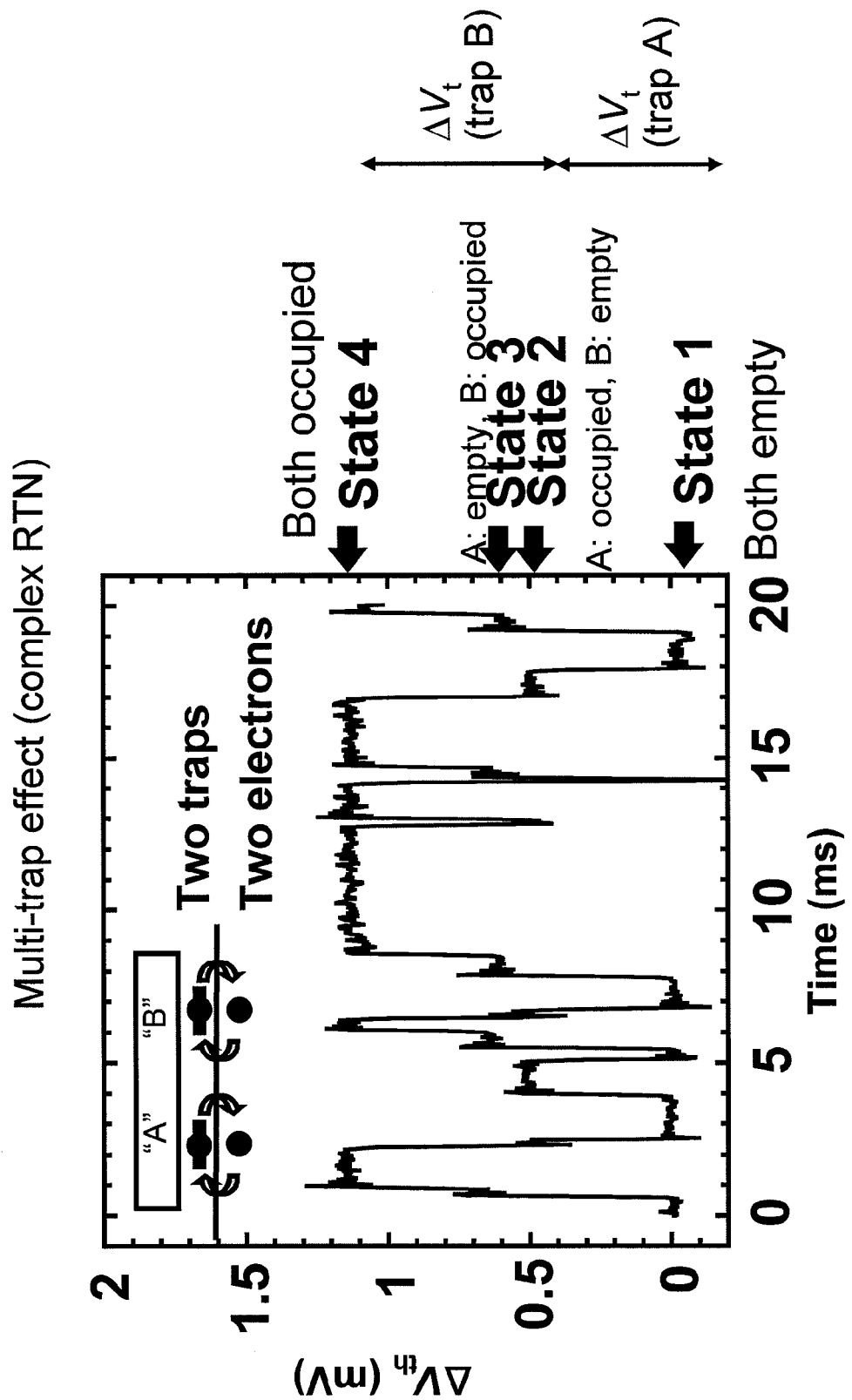
FIG. 5 is an example complex RTN waveform due to multi-trap effect.

With respect to FIG. 5, there is shown a complex RTN waveform due to multi-trap effect (two traps in this example). As shown in FIG. 5, it is seen that the multi-trap effect causes a relatively greater impact on device threshold voltage, Vth, than a single defect trap because of the state 1 (both traps empty) and state 4 (both traps occupied).

Therefore, embodiments can include a first stage 10 for resolving a number of stable states in a time series representing a multi-trap defective device, along with the activated/deactivated status of each defect, using a histogram analysis.

Figure 6:
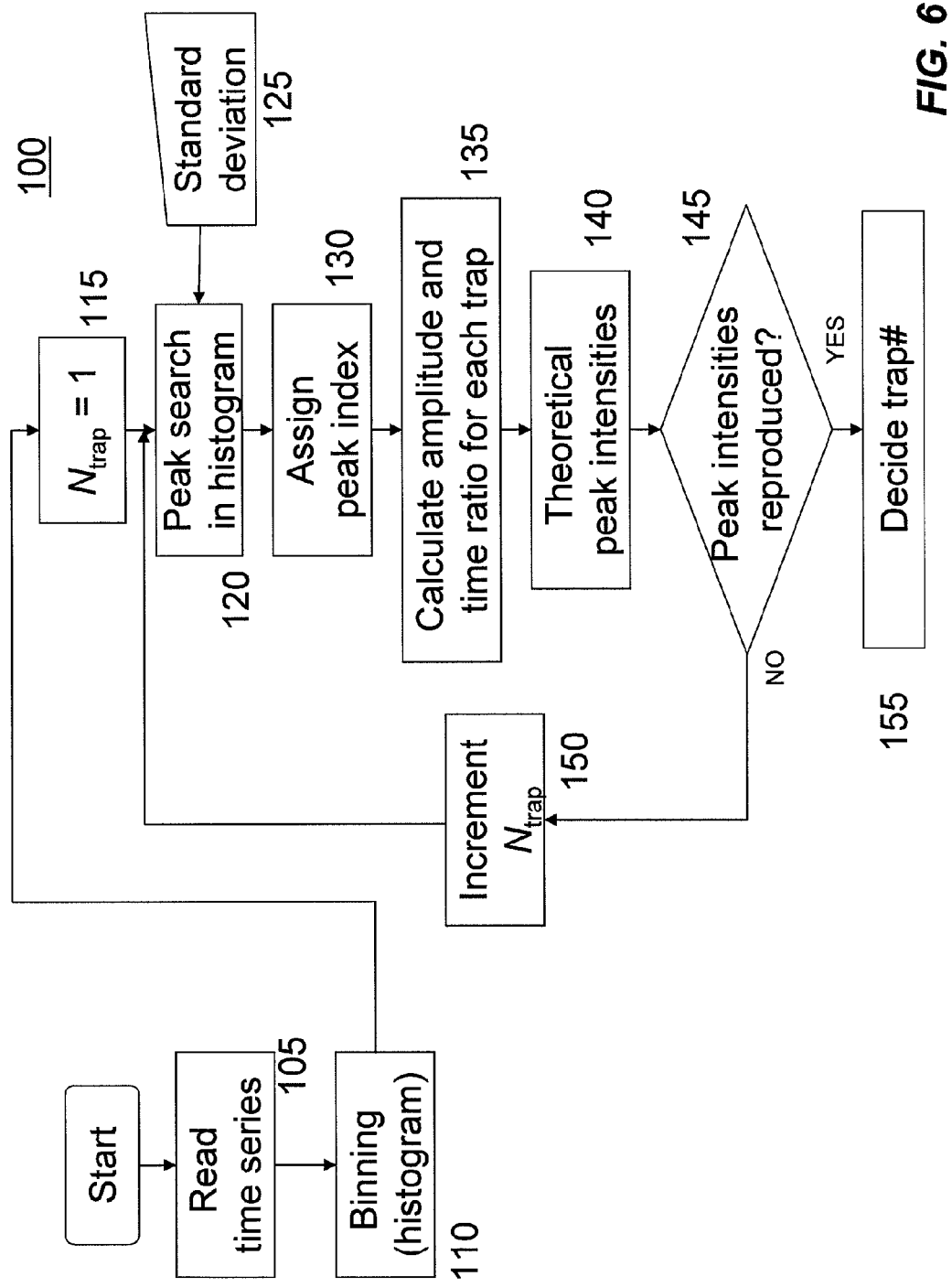
FIG. 6 is a flowchart of a characteristic physical constant extraction method of a first stage according to various embodiments.

For example, FIG. 6 is a flowchart of a characteristic physical constant extraction method 100 of a first stage 10 according to various embodiments. The method 100 provides determination of the number of traps or defects in a given semiconductor device. Referring to FIG. 6, the method 100 can include reading a time series by, for example, receiving and optionally storing signal data representing a change in a drain current of a semiconductor device over time, at 105. The time series signal comprises a time series of values. Next, the method 100 can include constructing a histogram representation of the signal by binning each value, at 110. A counter of the number of traps is set to an initial value of 1 (Ntrap=1), at 115. Next, the method can include determining a plurality of peaks of the histogram representation, each peak being associated with a state of a Random Telegraph Noise (RTN) signal caused by a plurality of bistable traps of mobile charge carriers in the semiconductor device, at 120. In searching the peaks, the method uses a standard deviation that is based on known or measured physical characteristics of the measurement instruments, at 125. For example, the first stage gives the left-hand quantity of Eq. 1 ($\tau e/\tau c$). By measuring the quantity at various temperatures, the difference ET-EF can be obtained using the equation (Eq. 1). The energy level is an important characteristic among others, since it has a close relationship with physical origin of the trap. Then, a peak index value is assigned for each of the peaks, at 130.

After a peak index value is assigned for each of the peaks, the method can proceed to 135, at which an amplitude and a time constant ratio is calculated for each of the traps. Next, the theoretical intensities are determined for each said peak, at 140. Then, the method next checks to determine if the theoretical peak intensities have been reproduced, at 145. If not, then the number of traps determined is incremented by 1, at 150, and the steps 120 through 145 are repeated. If at 145 the theoretical peak intensities have been reproduced, then the method determines the number of traps present, at 155. Thus, the method 100 of the first stage determines a number of traps based on a correspondence between the calculated amplitude and time constant ratio for each trap and the theoretical intensity for each peak associated with each trap.

Figure 7:
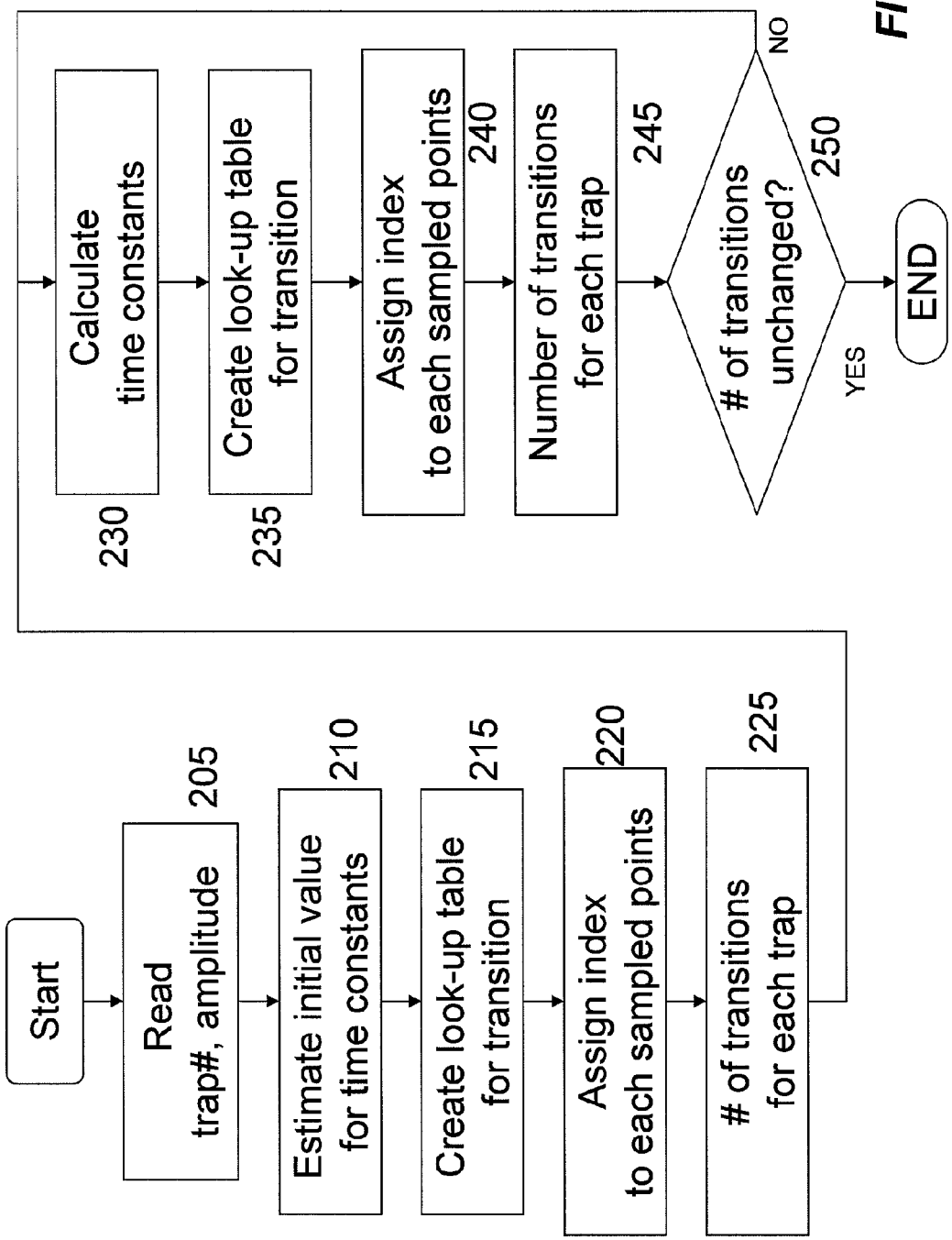
FIG. 7 is a flowchart of a method of calculating time constants through transition-based assignment of states using a second stage according to various embodiments.

Furthermore, FIG. 7 is a flowchart of a method 200 of calculating time constants through transition-based assignment of states using a second stage 20 according to various embodiments. In the second stage 20, the method 200 can assign a peak index value creating a look-up table defining a number of allowed next-state transitions from each state, where each allowed next-state transition is a transition to a state that differs from a current state by 1 binary digit, and in which the allowed next-state transitions exclude transitions to any state other than one of the allowed next-state transitions, to prevent state assignment errors caused by Gaussian noise during said assigning a peak index value.

In particular, referring now to FIG. 7, a method 200 can include reading or inputting the number of traps and their amplitudes from the first stage (refer to FIG. 6), at 205, and then estimating initial values for the corresponding time constants at 210. Next, the method includes creating a look-up table defining a number of allowed next-state transitions from each state, at 215. Then, an index value is assigned to each sampled point or value of the time series, at 220, and the number of transitions for each trap is determined, at 225. Following this determination, the time constants are calculated for each trap using the relationship between average holding time and transition rate, which is explained at Equation (1) above, at 230. Then, a revised look-up table defining the allowed next-state transitions from each state is computed, at 235, followed by revised index value assignment to each sampled point or value of the time series, at 240. Next, the number of transitions for each trap is determined again, at 245. Then, at 250, if at 245 the number of transitions determined for each trap is different from the previous determination, then steps 230 through 250 are repeated recursively until the number of transitions determined is unchanged from the previous determination, in which case the method 200 ends. In this way, the assignment of states is uniquely determined.

Figure 8:
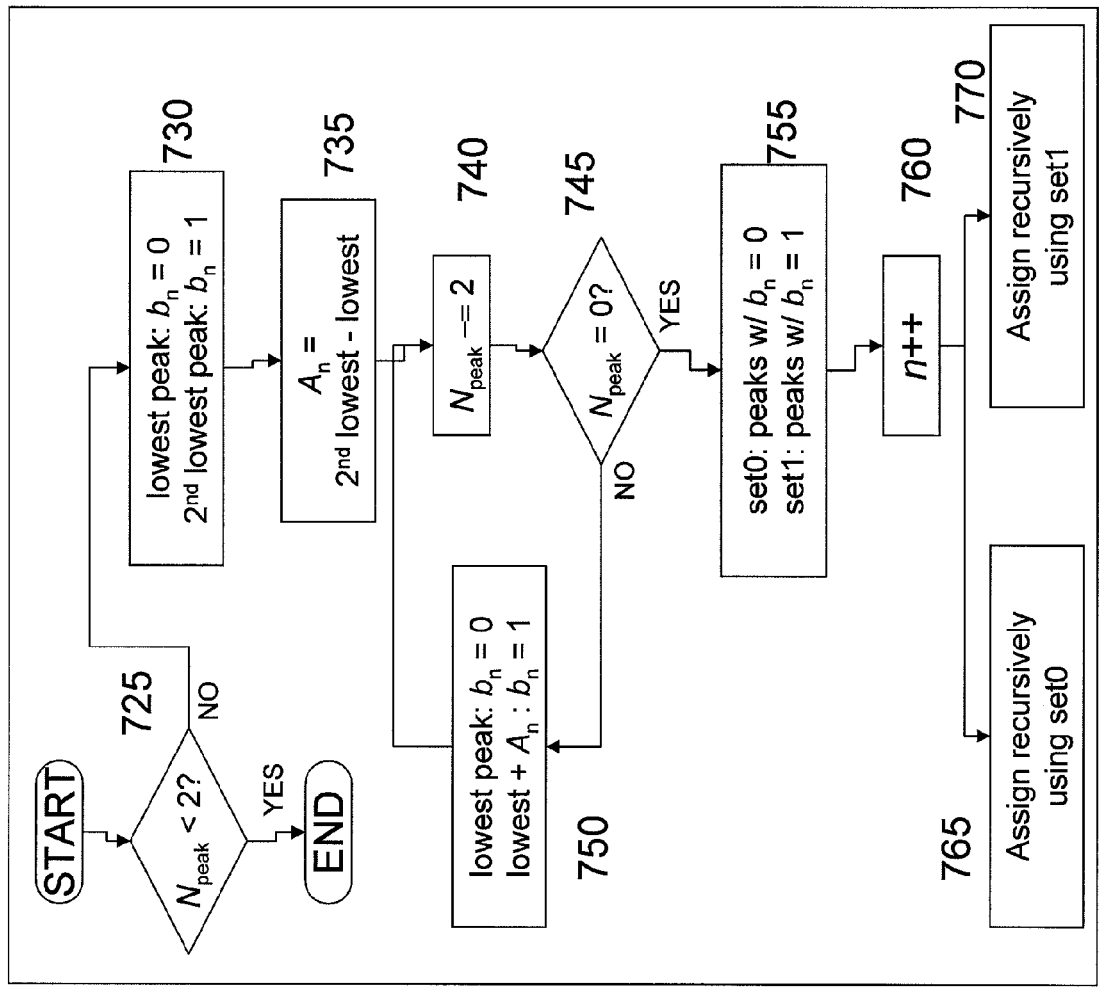
FIG. 8 is a flowchart of a recursive method of assigning peak index values.
Figure 8:
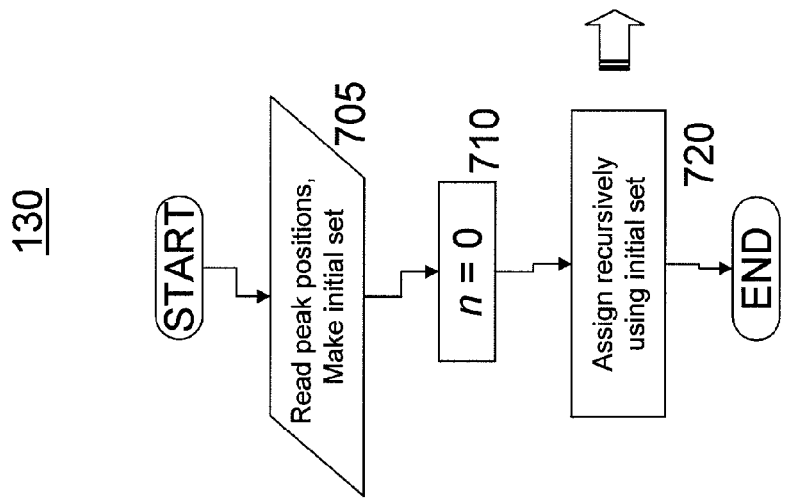

Furthermore, the step of assigning a peak index value can be performed according to various techniques. For example, FIG. 8 is a flowchart of a recursive method of assigning peak index values at step 130 in the first stage. Referring now to FIG. 8, the method of recursively assigning a peak index value includes obtaining the peak positions from the time series and constructing an initial set of peak positions, at 705. The trap number of interest is set to 0, at 710. Then, peak indexes are assigned recursively using the procedure 720.

For example, in various embodiments, the recursive assignment of peak indexes at 720, includes, initially, determining if the number of peaks is less than two, at 725. If so, then the step 720 has been completed. If not, then the step 720 includes assigning a lowest peak index value to one of the states in which all of the traps are in an empty condition, wherein each of the states is comprised of a first state value indicating the empty trap condition (for example, 0) and a second state value indicating the capture condition (for example, 1), at 730. The transition from the first state value to the second state value represents capture of an electron by an associated trap, and a transition from the second state value to the first state value represents release of an electron from the associated trap. The drain current of the semiconductor device changes between at least two stable states in response to each transition.

The method continues by assigning the first state value indicating the empty condition to a lowest peak other than the lowest and the next lowest peaks associated with step 730. An offset value (An) is calculated as the difference in position between the lowest and the next lowest peaks at 735. The number of peaks is then decremented by 2, at 740, and the method checks to see if there are any remaining peaks to be assigned, at 745. If there are more peaks to be assigned, then at 750 the method determines a peak which is at the lowest position in the remaining peaks, and the nearest in position in which the peak value is the lowest peak in step 750 plus the offset value An determined at 735. At step 750, the lowest peak is given an empty state with respect to the trap number of interest. The other peak which is positioned at An from the lowest peak is given an occupied state similarly. The steps 725 through 750 are then repeated for all peaks in the histogram.

Figure 9:
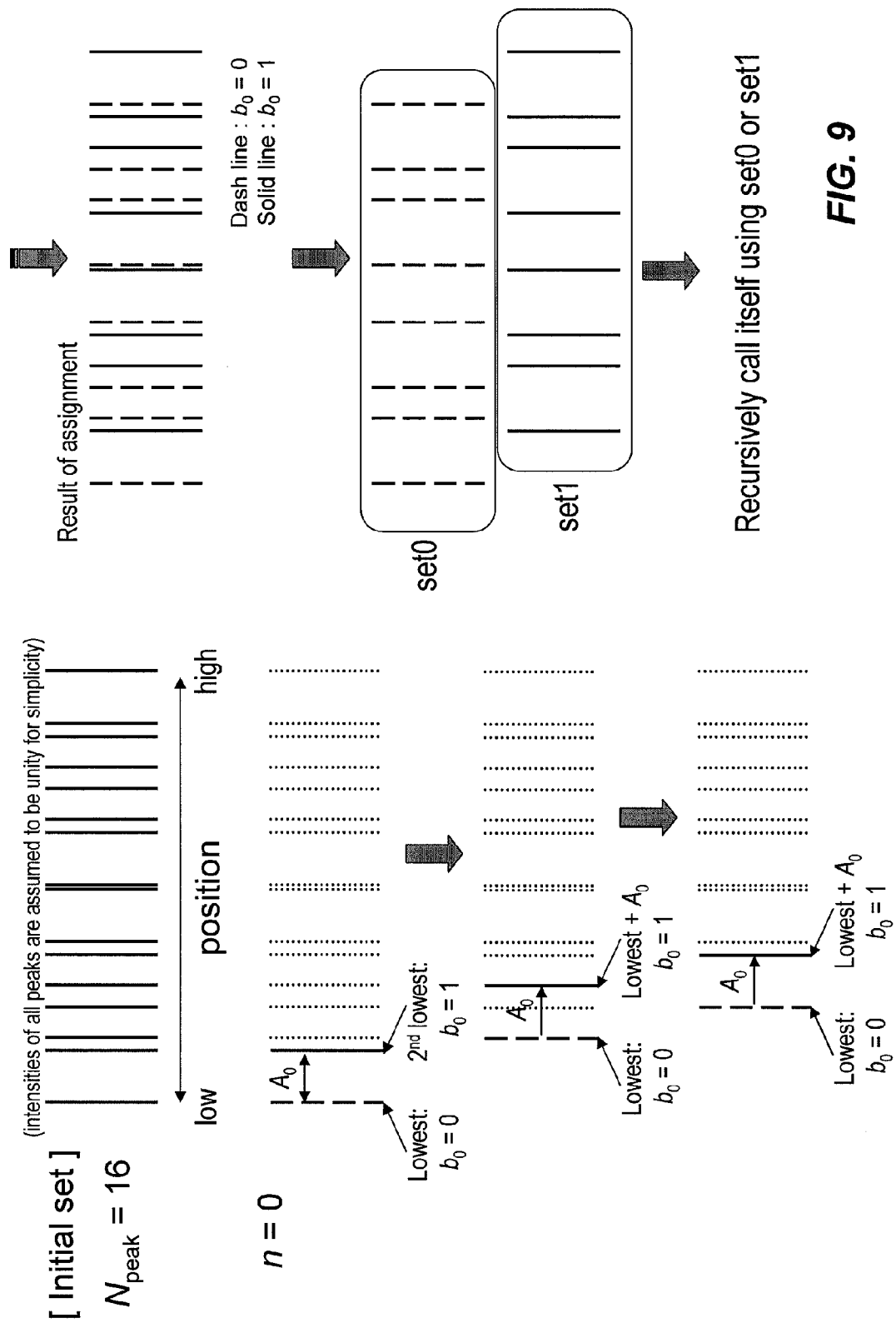
FIG. 9 is an illustration of recursive assignment of peak indexes.

The method of step 720 then continues by classifying all peaks in the histogram into one of a first set consisting of peaks assigned the first state value indicating the empty condition and a second set consisting of peaks assigned the second state value indicating the capture condition, at 755. At 760, 765, and 770, steps 725 through 755 are recursively applied to the first set of peaks and to the second set of peaks. FIG. 9 is an illustration of the recursive assignment of peak indexes using the first and second sets peaks according to step 130.

Although FIG. 8 illustrates a recursive method of assigning peak index values starting with the lowest peak index value, it is to be understood that the recursive method of assigning peak index values can also be performed starting with the highest peak index value. In that case, the step 720 includes assigning a highest peak index value to one of the states in which all of the traps are in a capture condition, wherein each of the states is comprised of a first state value indicating the empty trap condition (for example, 0) and a second state value indicating the capture condition (for example, 1), at 730. The transition from the first state value to the second state value represents capture of an electron by an associated trap, and a transition from the second state value to the first state value represents release of an electron from the associated trap. The drain current of the semiconductor device changes between at least two stable states in response to each transition.

The method in this case continues by assigning the second state value indicating the capture condition to a highest peak other than the highest and the next highest peaks associated with step 730. An offset value (An) is calculated as the difference in position between the highest and the next highest peaks at 735. The number of peaks is then decremented by 2, at 740, and the method checks to see if there are any remaining peaks to be assigned, at 745. If there are more peaks to be assigned, then at 750 the method determines a peak which is at the highest position in the remaining peaks, and the nearest in position in which the peak value is the highest peak in step 750 plus the offset value An determined at 735. At step 750, the highest peak is given an occupied or capture state with respect to the trap number of interest. The other peak which is positioned at An from the highest peak is given an empty state similarly. The steps 725 through 750 are then repeated for all peaks in the histogram.

The method of step 720 then continues by classifying all peaks in the histogram into one of a first set consisting of peaks assigned the first state value indicating the empty condition and a second set consisting of peaks assigned the second state value indicating the capture condition, at 755. At 760, 765, and 770, steps 725 through 755 are recursively applied to the first set of peaks and to the second set of peaks.

Figure 10:
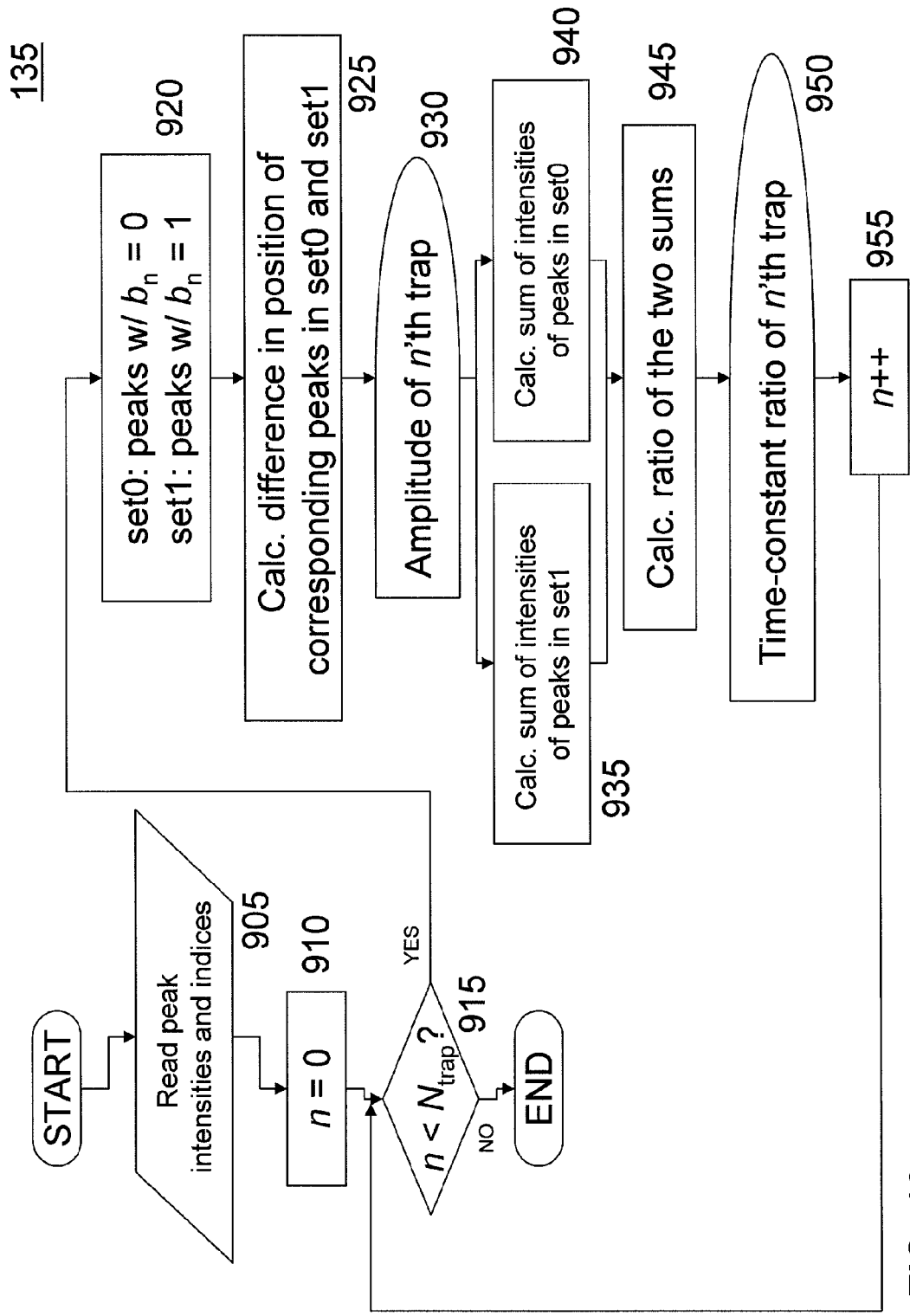
FIG. 10 is a flowchart of a method of calculating an amplitude and a time constant ratio for each trap.
Figure 11:
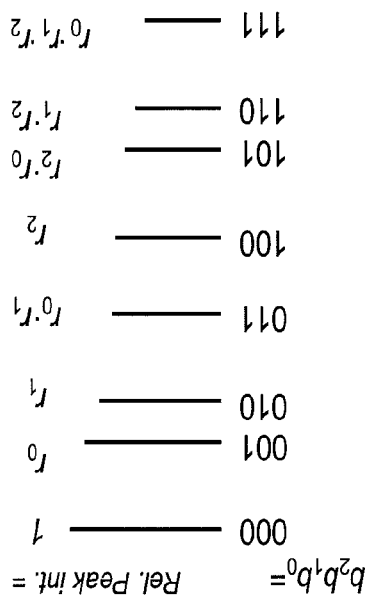
FIG. 11 is an illustration of the calculating an amplitude and a time constant ratio for each trap.
Figure 11:
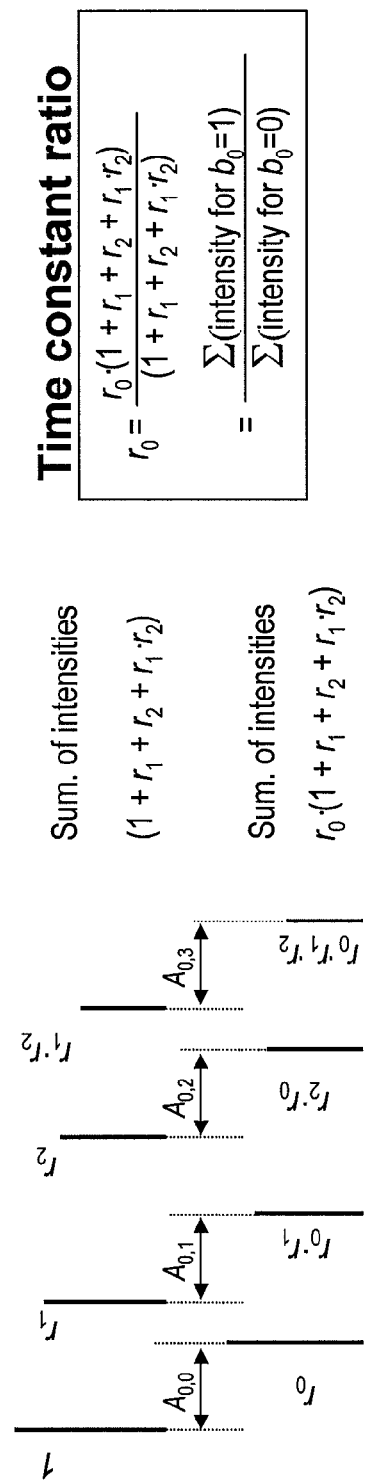

In addition, the step of calculating an amplitude and a time constant ratio for each trap can be performed according to various techniques. For example, FIG. 10 is a flowchart of a method of calculating an amplitude and a time constant ratio for each trap at step 135 in the first stage. Referring now to FIG. 10, the method of calculating an amplitude and a time constant ratio for each trap 135 can include obtaining or reading the peak intensities and indices at 905, and setting an initial index value to 0, at 910. Then at 915, it is determined if the index value is less than the number of traps. If not, then the step 135 has been completed. If so, then the step 135 further includes obtaining or reading the first set (consisting of peaks assigned the first state value indicating the empty condition) and the second set (consisting of peaks assigned the first state value indicating the capture condition). Next, for each trap, the difference in position between corresponding peaks in the first set and the second set are calculated, at 925. Based on the difference, an amplitude is determined, at 925. Next, a first sum is calculated based on intensities of the peaks of the first set, at 935, and a second sum is calculated based on intensities of the peaks of the second set, at 940. Then, a ratio of the first and sums is determined, at 945. Based on the ratio, time constant ratio is determined, at 950. At 955, the index value n is incremented by 1, and the method returns to 915 at which the steps 915 through 955 are repeated. FIG. 11 is an illustration of an example of the calculating of an amplitude and a time constant ratio for each trap according to step 135.

Figure 12A:
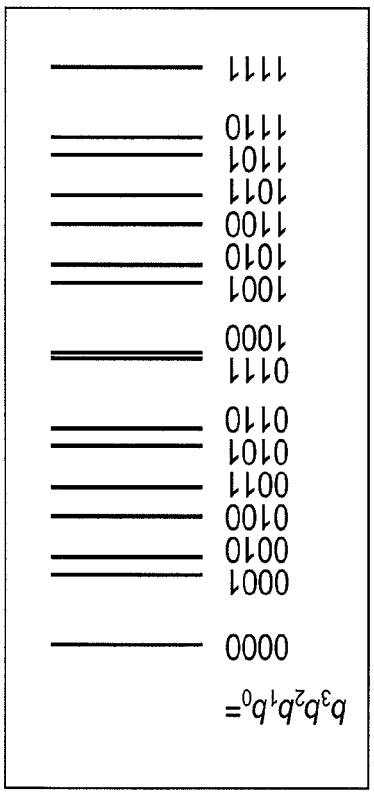
FIGS. 12A and 12B illustrate a method of inhibiting next-state transitions in creating a look-up table defining allowed state transitions according to various embodiments.
Figure 12B:
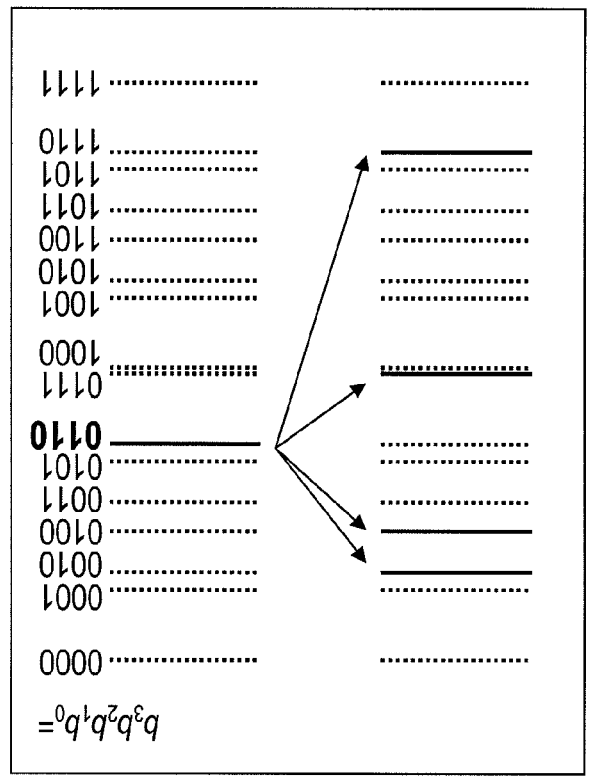

As discussed hereinabove with respect to FIG. 7, the method 200 of the second stage 20 includes creating a look-up table defining a number of allowed next-state transitions from each state, at 235. Each allowed next-state transition is a transition to a state that differs from a current state by 1 binary digit. The allowed next-state transitions exclude transitions to any state other than one of the allowed next-state transitions, to prevent state assignment errors caused by Gaussian noise during said assigning a peak index value. For example, FIGS. 12A and 12B illustrate a method of inhibiting next-state transitions in creating the look-up table. Referring now to FIG. 12A, there is shown an example of 16 peaks associated with a device that has four traps. Each of the sixteen peaks has one of the states 0000 through 1111 assigned to it. As shown in FIG. 11B, because the probability of simultaneous change of two or more traps is negligible, this can be used to determine a selection rule for defining allowed next-state transitions. In this example, the selection rule is that next-state transitions are allowed only for a transition to a state that differs from a current state by 1 binary digit (e.g., when the previous state is "0110," a transition is only possible to the next states "0010," "0100," "0111," or "1110," and a transition to any of the other eleven states is prohibited). This greatly enhances the accuracy and resolution of assignment of states, especially when two states are close to each other, thus preventing state assignment errors. Furthermore, by restricting the number of allowed next-state transitions, the method 200 can be executed very quickly by a computer or a processor, as the compute-intensity of the algorithm is relatively reduced.

Figure 13B:
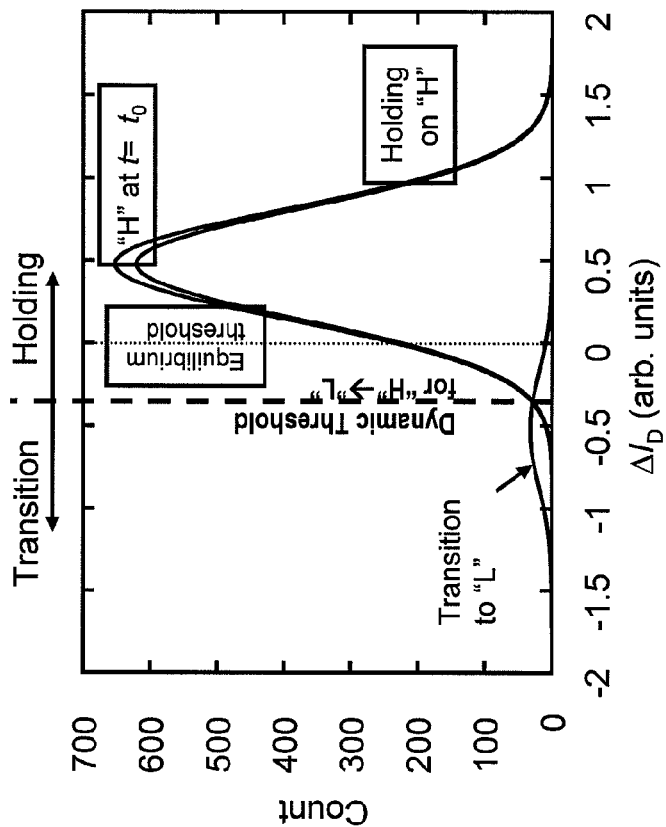
FIGS. 13A and 13B illustrate a method of determining transition-based assignments, according to various embodiments.
Figure 13A:
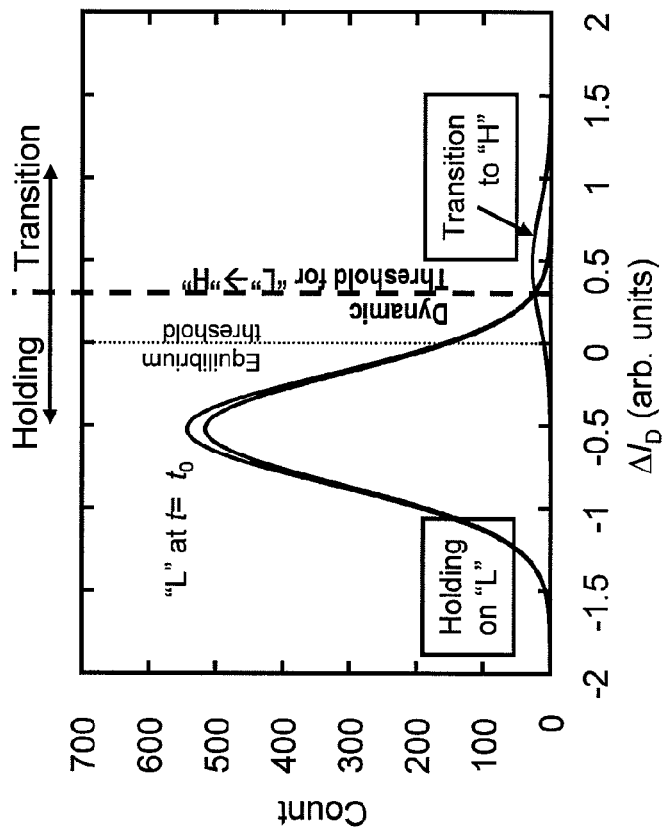

Furthermore, the second stage 20 uses the memoryless characteristics of Random Telegraph Noise (RTN) in determining transition-based assignments, as shown in FIGS. 13A and 13B. The inventors have observed that the dynamic holding to transition threshold is different from the equilibrium threshold for both a trap that is holding on a low state ("L") and transitioning to a high state ("H") as shown in FIG. 13A, and a trap that is holding on a high state ("H") and transitioning to a low state ("L") as shown in FIG. 13B. Therefore, the method of the second stage 20 takes advantage of this condition in uniquely assigning a given data point to a state based on a definite dynamic threshold that is different from an equilibrium threshold. For example, as shown in FIG. 13B, if the transition probability per unit time is always constant ($1/\tau_H$ or $1/\tau_L$), then for a trap in an "H" state at $t=t_0$, a successive state after $\Delta t$ will be found with a probability of a transition (to the "L" state) of $\Delta t/\tau_H$ and a probability of holding (on "H" state) of $1-\Delta t/\tau_H$. A similar rule is applicable to the "L" to "H" case shown in FIG. 13A.

Figure 14:
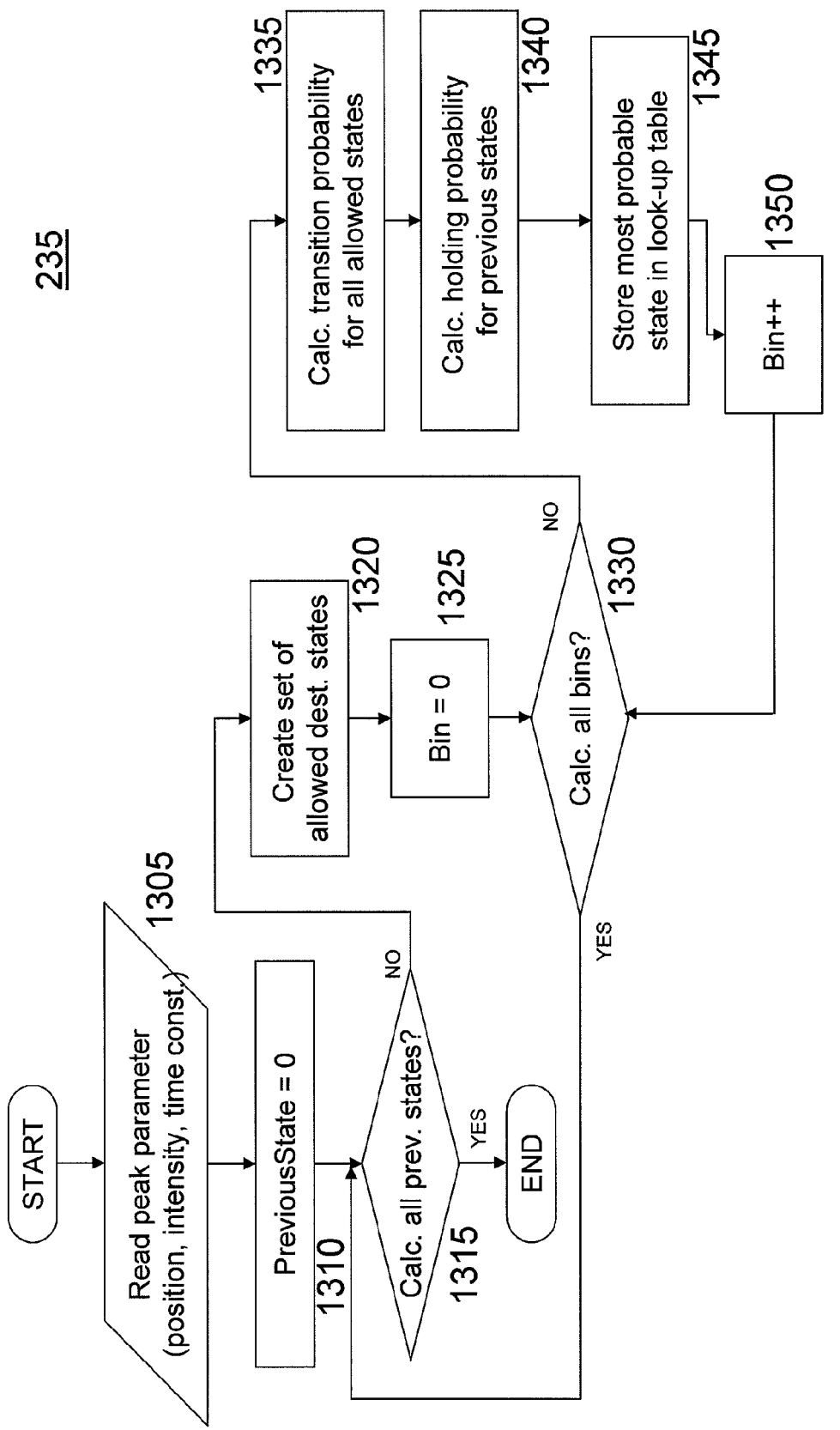
FIG. 14 is a flowchart of a method of creating a look-up table defining a number of allowed next-state transitions from each state.

In addition, FIG. 14 is a flowchart of a method of creating a look-up table defining a number of allowed next-state transitions from each state, at 235 of FIG. 7. Referring now to FIG. 14, the method of creating a look-up table defining a number of allowed next-state transitions from each state includes obtaining or reading peak parameters such as, for example, peak position, intensity, and associated time constants, at 1305. Initially, at 1310, a previous state counter is set to 0. Then at 1315, it is determined if the look-up table contents for all previous states has been calculated. If so, then the step 235 has been completed. If not, then the step 235 further includes creating a set of allowed destination states as discussed hereinabove with respect to FIG. 12, at 1320. Next, the bin for the destination state being processed is set initially to 0, at 1325. Then at 1330, it is determined if all bins for the state being processed have been calculated. If so, then the method returns to 1315. If not, then the method continues to 1335 at which the transition probability is calculated for all allowed states, and then to 1340 at which the holding probability is calculated for the holding state, as described, for example, with respect to FIGS. 13A and 13B. Next, the most probable next state is stored in a computer-readable storage medium or memory, at 1345, the bin counter is incremented by 1 at 1350, and the method returns to 1330. FIG. 15 is an illustration of an example of an allowed state transition look-up table output and stored according to various embodiments.

Thus, the present invention provides a method of extracting characteristic physical constants from a complex Random Telegraph Noise (RTN) signal, the method including resolving a number of stable states in a time series, the stable states being associated with a plurality of defects in a semiconductor device and the time series comprising a plurality of data points, then determining an activation status of each defect. Next the method includes calculating a transition preference table based on physically allowed transitions, and then uniquely assigning each data point of the time series to one stable state using the transition preference table. Each defect is a bistable trap of a mobile charge carrier in a semiconductor device. A plurality of such defects causes Random Telegraph Noise (RTN) in a voltage threshold of one or more gates of the semiconductor device. The present invention is capable of reliably detecting the presence of multiple defects (two defects, three defects, four defects, and so on) in the semiconductor device.

Figure 16:
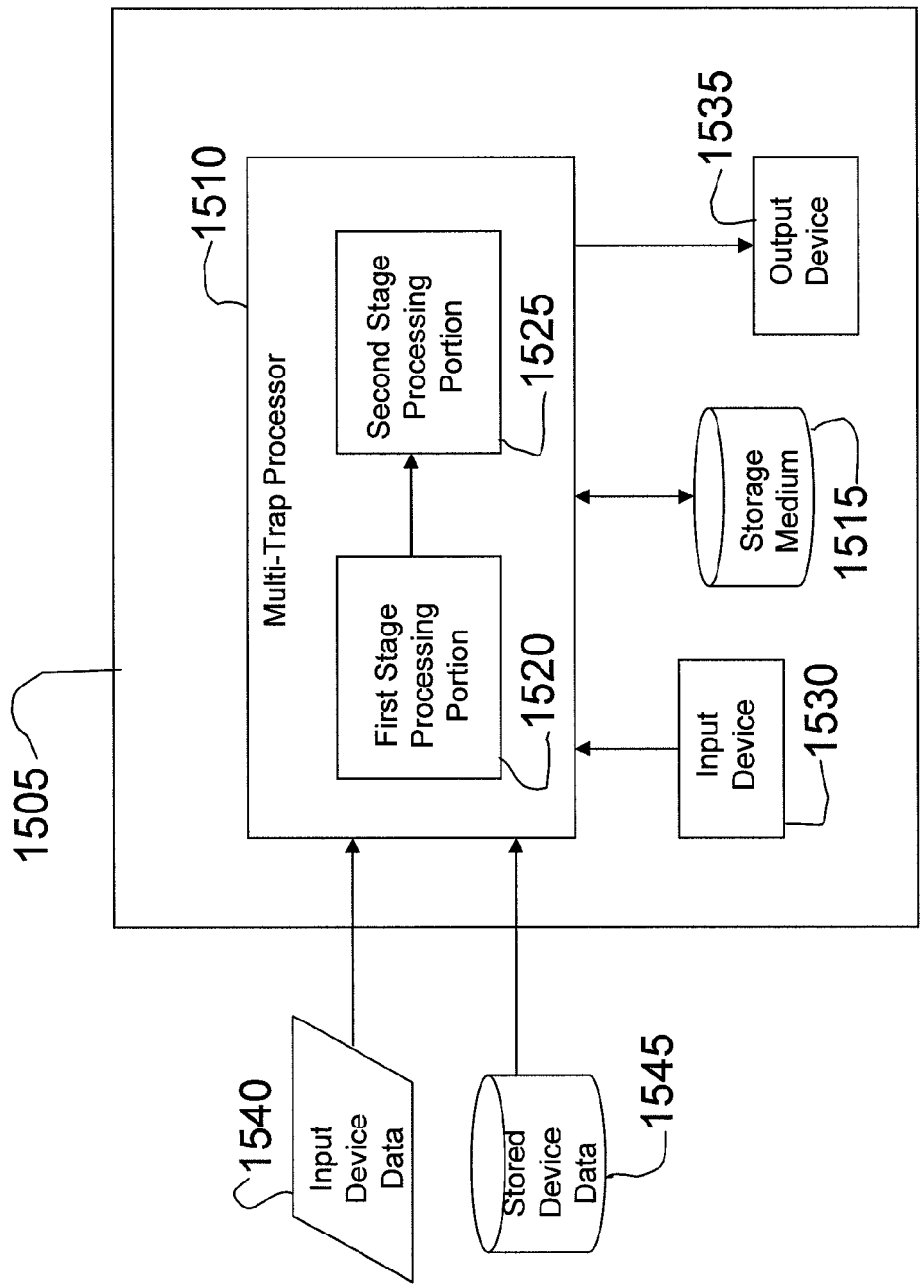
FIG. 16 is a functional block diagram of an apparatus for extracting characteristic physical constants from a complex Random Telegraph Noise (RTN) signal according to at least one embodiment.

Furthermore, the present invention also comprises an apparatus for extracting characteristic physical constants from a complex Random Telegraph Noise (RTN) signal according to the methods discussed hereinabove. FIG. 16 is a functional block diagram of an apparatus for extracting characteristic physical constants from a complex Random Telegraph Noise (RTN) signal according to at least one embodiment. Referring now to FIG. 16, the apparatus 1505 includes a multi-trap processor 1510 which has a first stage processing portion 1520 and a second stage processing portion 1525. The first stage processing portion 1520 and a second stage processing portion 1525 are each respectively configured to perform the first stage 10 and second stage 20 functions, respectively, as described herein. The multi-trap processor 1510 receives or retrieves the time series data for a given semiconductor device in the form of input device data 1540 from a device testing apparatus, or in the form of stored device data 1545 from a storage device. Alternatively, the apparatus 1505 may be a part of a device testing system or apparatus.

The multi-trap processor 1510 is operably coupled to an input device 1530 for receiving input commands and data, to an output device 1535 for displaying, sending, or printing output data, and to a storage medium 1515 upon which may be stored data and programmed instructions retrievable and executable by the processor 1510.

In particular, the first stage processing portion 1520 is configured to resolve a number of stable states in a time series, in which the stable states are associated with a plurality of defects, the time series comprising a plurality of data points.

The first stage processing portion 1520 is also configured to determine an activation status of each defect.

The second stage processing portion 1525 is configured to calculate a transition preference table based on physically allowed transitions, and to uniquely assign each data point of the time series to one stable state using the transition preference table. Each defect comprises a bistable trap of a mobile charge carrier in the semiconductor device, and the plurality of defects causes Random Telegraph Noise (RTN) in a voltage threshold of one or more gates of the semiconductor device.

Furthermore, the first stage processing portion 1520 is also configured to assign a peak index value for each of a plurality of peaks of the time series, each peak being associated with one defect, to calculate an amplitude and a time constant ratio for each defect, to determine a theoretical intensity for each peak, and to determine the number of defects in the device based on a correspondence between the calculated amplitude and time constant ratio for each peak and theoretical intensity for each peak associated with each defect. In particular, the first stage processing portion 1520 is configured to assign a peak index value for each of a plurality of peaks using a standard deviation based on physical characteristics of a measuring system.

In at least one embodiment, the first stage processing portion 1520 and the second stage processing portion 1525 are configured to calculate the amplitude and time constant ratio in parallel for a first set and a second set of peaks.

The second stage processing portion 1525 is further configured to uniquely assign each data point based on a dynamic threshold that is different from an equilibrium threshold.

It is to be understood that the measured change in drain current and the measured change in threshold voltage, as referred to herein, are interchangeable as the two parameters are related through transconductance, $g_m$.

It is to be understood that the method of extracting and determining characteristic physical constants of random telegraph noise (RTN), especially when the RTN is so-called "complex" RTN which is produced by two or more defects, and an apparatus for performing the method, can be implemented as a sequence of programmed instructions which, when executed by the multi-trap processor 1510, cause the multi-trap processor 1510 to perform the operations described herein. Alternatively, the apparatus and method for extracting and determining characteristic physical constants of random telegraph noise RTN can be implemented using hardware elements (for example, one or more Application Specific Integrated Circuits (ASICs)) of the multi-trap processor 1510 that are designed to perform the operations described herein. In either case, the multi-trap processor 1510 can comprise a special purpose machine that is configured to extract and determine characteristic physical constants of random telegraph noise RTN.

In various embodiments, the multi-trap processor 1510 can be implemented using an Integrated Circuit (IC) based processing or computing device such as, for example, a processor, microprocessor, microcontroller, or may be comprised of control logic including integrated circuits such as, for example, one or more Application Specific Integrated Circuits (ASICs). The multi-trap processor 1510 can also include standard supporting circuitry and/or peripheral devices operably coupled to the processing device in any suitable manner. Communication can be facilitated by, for example, one or more data/command buses. In various embodiments, the circuit elements comprising the multi-trap processor 1510 and its peripherals or supporting circuits can be provided in communication using, for example, a parallel data/command bus, or one or more discrete inputs and outputs. For example, according to various embodiments, the multi-trap processor 1510 can be coupled to an input device or input means such as, for example, a keyboard, keypad or a plurality of keypads, buttons, switches, levers, knobs, an interactive Liquid Crystal Display (LCD), touchscreen (not shown), for receiving service request inputs or data input by a user. The input device 1530 can also be an electronic or optical interface for receiving data from another computing device or processor, or from a communication device or network.

In various embodiments, the multi-trap processor 1510 can execute a sequence of programmed instructions. The instructions can be compiled from source code instructions provided in accordance with a programming language such as, for example, C#, Java, or C++. The instructions can also comprise code and data objects provided in accordance with, for example, the Visual Basic™ language, or another object-oriented programming language. The sequence of programmed instructions can be flexible in what platforms and network configurations it can run on, in most cases requires only configuration file changes, and makes use of different programming languages to enable its functionality. It is preferably modular, such that modules can be added, moved to a different platform, or removed with minimal configuring.

The sequence of programmed instructions and data associated therewith can be stored in a computer-readable storage medium such as a computer memory or storage device which may be any suitable memory apparatus, such as, but not limited to ROM, PROM, EEPROM, RAM, flash memory, and the like. Alternatively, the multi-trap processor 1510 may comprise an Application Specific Integrated Circuit (ASIC) including hard-wired circuitry designed to perform the operations described herein.

It will be appreciated that the modules, processes, systems, and sections described above can be implemented in hardware, software, or both. Also, the modules, processes systems, and sections can be implemented as a single processor or as a distributed processor. Further, it should be appreciated that the steps mentioned above may be performed on a single or distributed processor. Also, the processes, modules, and sub-modules described in the various figures of the embodiments above may be distributed across multiple computers or systems or may be co-located in a single processor or system. Exemplary structural embodiment alternatives suitable for implementing the modules, sections, systems, means, or processes described herein are provided below.

The modules, processors or systems described above can be implemented as a programmed general purpose computer, an electronic device programmed with microcode, a hard-wired analog logic circuit, software stored on a computer-readable medium, an optical computing device, a networked system of electronic and/or optical devices, a special purpose computing device, an integrated circuit device, a semiconductor chip, and a software module or object stored on a computer-readable medium, for example.

Embodiments of the method and system (or their sub-components or modules), may be implemented on a general-purpose computer, a special-purpose computer, a programmed microprocessor or microcontroller and peripheral integrated circuit element, an ASIC or other integrated circuit, a digital signal processor, a hardwired electronic or logic circuit such as a discrete element circuit, a programmed logic circuit such as a PLD, PLA, FPGA, PAL, or the like. In general, any process capable of implementing the functions or steps described herein can be used to implement embodiments of the method, system, or a computer program product (software program).

Furthermore, embodiments of the disclosed method, system, and computer program product may be readily implemented, fully or partially, in software using, for example, object or object-oriented software development environments that provide portable source code that can be used on a variety of computer platforms. Alternatively, embodiments of the disclosed method, system, and computer program product can be implemented partially or fully in hardware using, for example, standard logic circuits or a VLSI design. Other hardware or software can be used to implement embodiments depending on the speed and/or efficiency requirements of the systems, the particular function, and/or particular software or hardware system, microprocessor, or microcomputer being utilized. Embodiments of the method, system, and computer program product can be implemented in hardware and/or software using any known or later developed systems or structures, devices and/or software by those of ordinary skill in the applicable art from the function description provided herein and with a general basic knowledge of the computer programming arts.

Moreover, embodiments of the disclosed method, system, and computer program product can be implemented in software executed on a programmed general purpose computer, a special purpose computer, a microprocessor, or the like.

Figure 17:
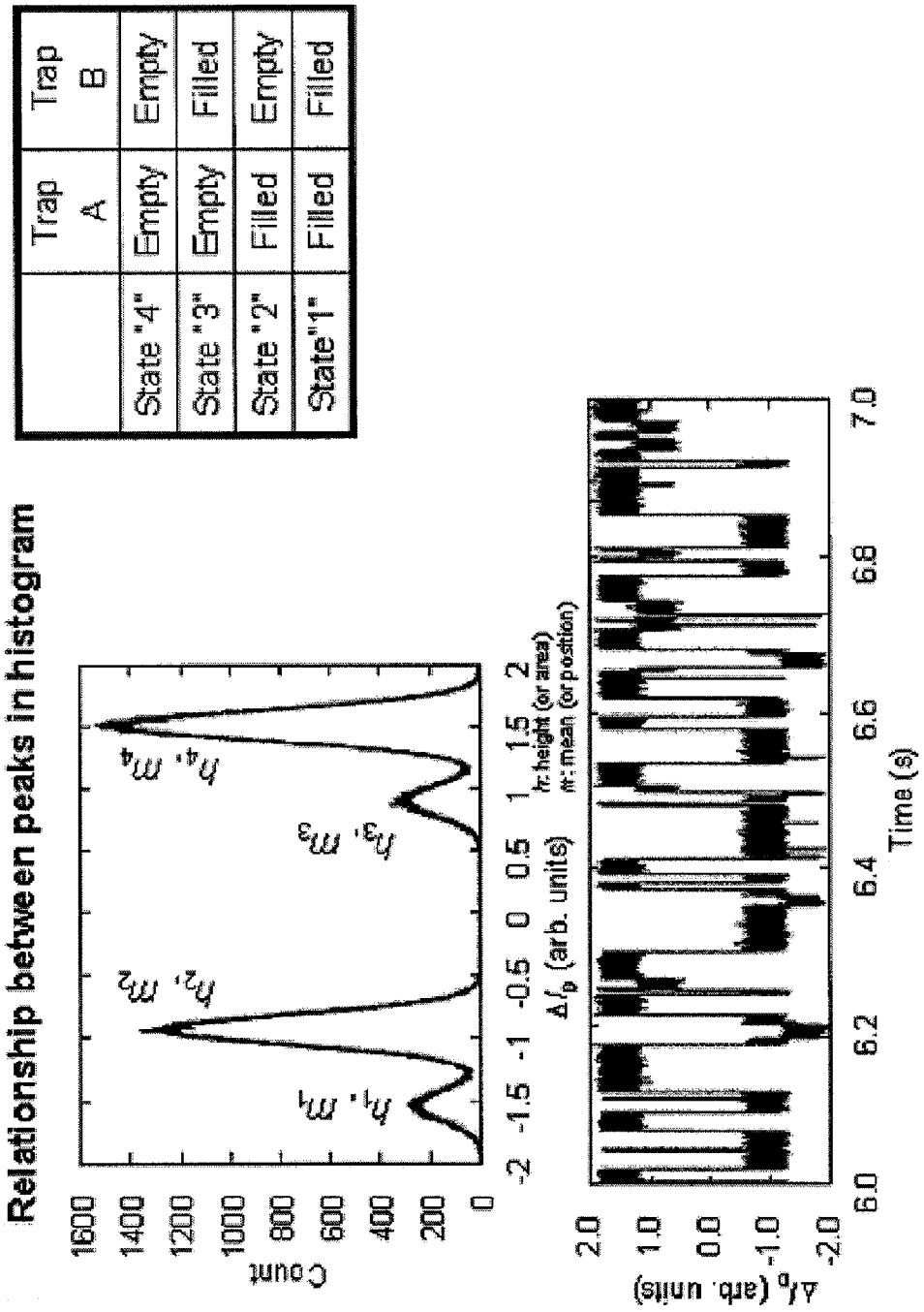
FIG. 17 illustrates a relationship between peaks in a histogram based on a time series showing change in drain current ($\Delta I_D$) of a given semiconductor device.

FIG. 17 illustrates a relationship between peaks in a histogram based on a time series showing change in drain current ($\Delta I_D$) of a given semiconductor device. As seen in FIG. 17, the method and apparatus of the present invention applies rules to determine four distinct stable states associated with two trap defects in the semiconductor device.

Figure 18:
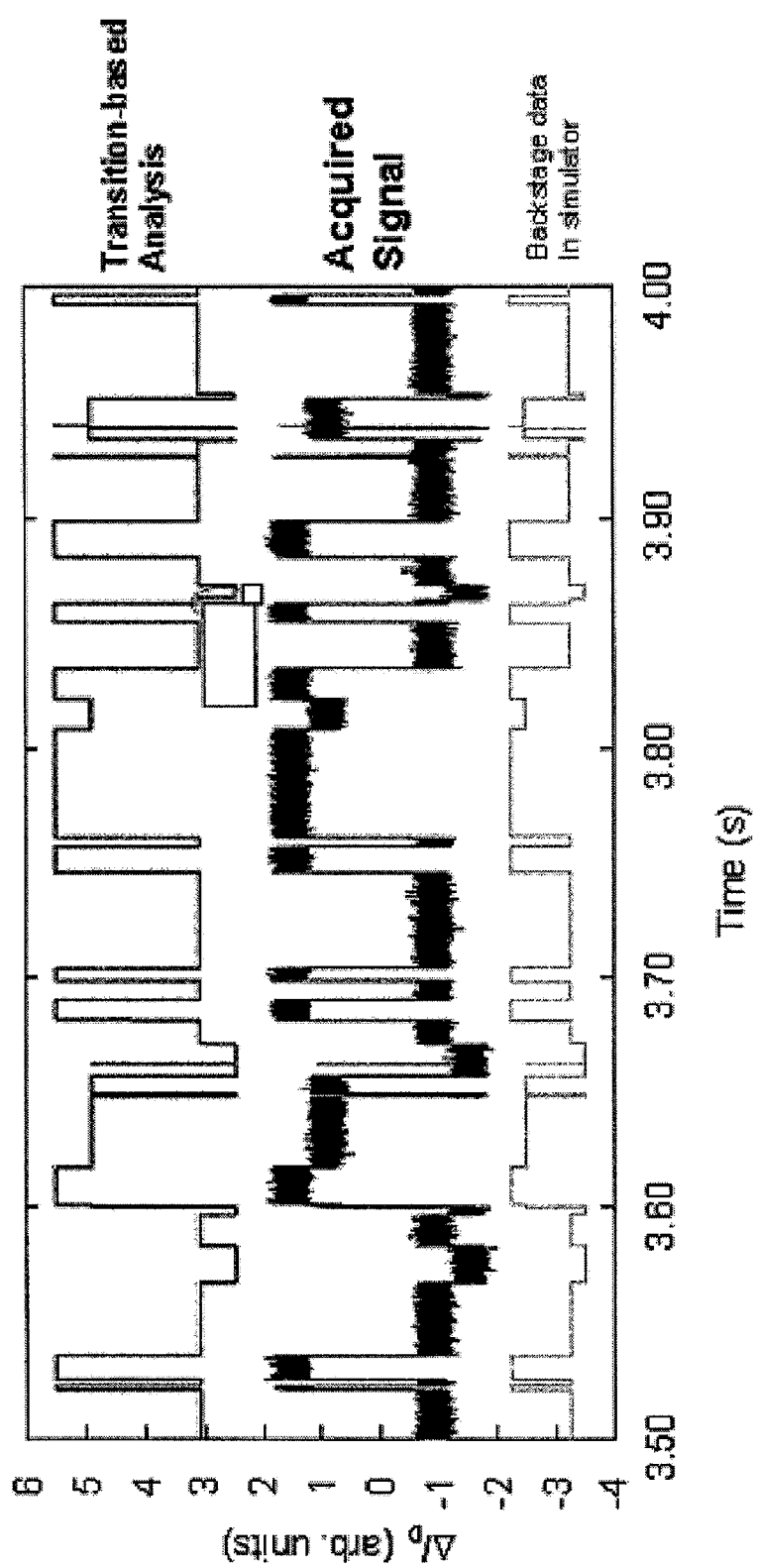
FIG. 18 is a further example of an extracted multi-trap time series obtained using an embodiment of the present invention.

FIG. 18 is a further example of an extracted multi-trap time series obtained using an embodiment of the present invention. The example shown in FIG. 18 was computed using a standard commercial processing device as the multi-trap processor 1510, executing a sequence of stored instructions that configured the processor 1510 to perform the functions described herein. In an embodiment, the processor 1510 performed the multi-trap time constant extraction operations described herein in less than three (3) seconds for an input time series having 1,000,000 data points.

It is, therefore, apparent that there is provided, in accordance with the various embodiments disclosed herein, apparatus and method for extracting and determining characteristic physical constants of random telegraph noise RTN. It is apparent that the present invention can be used to determine the presence of any number of multiple trap defects in a given semiconductor device.

While the invention has been described in conjunction with a number of embodiments, it is evident that many alternatives, modifications and variations would be or are apparent to those of ordinary skill in the applicable arts. Accordingly, Applicants intend to embrace all such alternatives, modifications, equivalents and variations that are within the spirit and scope of the appended claims.

What is claimed is:

1. A characteristic physical constant extraction method comprising:
    receiving a signal representing a change in a drain current of a semiconductor device over time, said signal comprising a time series of values;
    constructing a histogram representation of said signal by binning each said value;
    determining a plurality of peaks of said histogram representation, each said peak being associated with a state of a Random Telegraph Noise (RTN) signal caused by a plurality of bistable traps of mobile charge carriers in said semiconductor device;
    assigning a peak index value for each said peak;
    calculating an amplitude and a time constant ratio for each said trap;
    determining theoretical intensities for each said peak; and
    determining a number of said traps based on a correspondence between the calculated amplitude and time constant ratio for each said trap and said theoretical intensity for each peak associated with each said trap.

2. The method of claim 1, wherein said assigning a peak index value comprises:
    (a) assigning a lowest peak index value to one of said states in which all said traps are in an empty condition, wherein each said state is comprised of a first state value indicating the empty trap condition and a second state value indicating the capture condition, wherein a transition from said first state value to said second state value represents capture of an electron by an associated trap, and a transition from said second state value to said first state value represents release of an electron from the associated trap, and wherein the drain current of said semiconductor device changes between at least two stable states in response to said transitions;
    (b) assigning the first state value indicating the empty condition to a lowest peak other than the lowest peak associated with step (a) or the next lowest peak with respect thereto;
    (c) determining a peak which is nearest in time to a time position in which the peak value is the lowest peak in step (b) plus an offset value;
    (d) assigning the second state value indicating the capture condition to the peak determined in step (c);
    (e) repeating steps (b) through (d) for all peaks in said time series;
    (f) classifying all peaks in said time series into one of a first set consisting of peaks assigned the first state value indicating the empty condition and a second set consisting of peaks assigned the second state value indicating the capture condition;
    (g) recursively applying steps (a) through (f) to one of the first set and the second set.

3. The method of claim 2, wherein said determining a peak at step (c) comprises:
    for each said trap, calculating a difference in position between corresponding peaks in said first set and said second set to determine said amplitude;
    calculating a first sum based on intensities of the peaks of said first set;
    calculating a second sum based on intensities of the peaks of said second set; and
    for each said trap, calculating a ratio of said first and second sums to determine said time constant ratio.

4. The method of claim 2, wherein said assigning a peak index value further comprises:
    creating a look-up table defining a number of allowed next-state transitions from each said state, wherein each said allowed next-state transition is a transition to a state that differs from a current state by 1 binary digit; and
    wherein said allowed next-state transitions exclude transitions to any state other than one of said allowed next-state transitions, to prevent state assignment errors caused by Gaussian noise during said assigning a peak index value.

5. The method of claim 1, wherein said assigning a peak index value comprises:
    (a) assigning a highest peak index value to one of said states in which all said traps are in a capture condition, wherein each said state is comprised of a first state value indicating the empty trap condition and a second state value indicating the capture condition, wherein a transition from said first state value to said second state value represents capture of an electron by an associated trap, and a transition from said second state value to said first state value represents release of an electron from the associated trap, and wherein the drain current of said semiconductor device changes between at least two stable states in response to said transitions;

(b) assigning the second state value indicating the capture condition to a highest peak other than the highest peak associated with step (a) or the next highest peak with respect thereto;

(c) determining a peak which is nearest in time to a time position in which the peak value is the highest peak in step (b) plus an offset value;

(d) assigning the first state value indicating the empty condition to the peak determined in step (c);

(e) repeating steps (b) through (d) for all peaks in said time series;

(f) classifying all peaks in said time series into one of a first set consisting of peaks assigned the first state value indicating the empty condition and a second set consisting of peaks assigned the second state value indicating the capture condition;

(g) recursively applying steps (a) through (f) to one of the first set and the second set.

6. The method of claim 5, wherein said determining a peak at step (c) comprises:
for each said trap, calculating a difference in position between corresponding peaks in said first set and said second set to determine said amplitude;
calculating a first sum based on intensities of the peaks of said first set;
calculating a second sum based on intensities of the peaks of said second set; and
for each said trap, calculating a ratio of said first and second sums to determine said time constant ratio.

7. The method of claim 5, wherein said assigning a peak index value further comprises:
creating a look-up table defining a number of allowed next-state transitions from each said state, wherein each said allowed next-state transition is a transition to a state that differs from a current state by 1 binary digit; and
wherein said allowed next-state transitions exclude transitions to any state other than one of said allowed next-state transitions, to prevent state assignment errors caused by Gaussian noise during said assigning a peak index value.

8. A method of extracting characteristic physical constants from a complex Random Telegraph Noise (RTN) signal, the method comprising:
resolving a number of stable states in a time series, said stable states being associated with a plurality of defects in a semiconductor device, said time series comprising a plurality of data points;
determining an activation status of each said defect;
calculating a transition preference table based on physically allowed transitions; and
uniquely assigning each said data point of said time series to one said stable state using said transition preference table.

9. The method of claim 8,
wherein each said defect comprises a bistable trap of a mobile charge carrier in said semiconductor device, and wherein said plurality of defects causes Random Telegraph Noise (RTN) in a voltage threshold of one or more gates of said semiconductor device.

10. The method of claim 8, further comprising:
assigning a peak index value for each of a plurality of peaks of said time series, each said peak associated with one said defect;
calculating an amplitude and a time constant ratio for each said defect;
determining theoretical intensities for each said peak; and
determining a number of said defects based on a correspondence between said calculated amplitude and time constant ratio for each said defect and said theoretical intensity for each peak associated with said defect,
wherein said assigning a peak index value for each of a plurality of peaks uses a standard deviation based on physical characteristics of a measuring system.

11. The method of claim 10, wherein said assigning a peak index value comprises:
(a) assigning a lowest peak index value to one of said states in which all said traps are in an empty condition, wherein each said state is comprised of a first state value indicating the empty trap condition and a second state value indicating the capture condition, wherein a transition from said first state value to said second state value represents capture of an electron by an associated trap, and a transition from said second state value to said first state value represents release of an electron from the associated trap, and wherein the drain current of said semiconductor device changes between at least two stable states in response to said transitions;

(b) assigning the first state value indicating the empty condition to a lowest peak other than the lowest peak associated with step (a) or the next lowest peak with respect thereto;

(c) determining a peak which is nearest in time to a time position in which the peak value is the lowest peak in step (b) plus an offset value;

(d) assigning the second state value indicating the capture condition to the peak determined in step (c);

(e) repeating steps (b) through (d) for all peaks in said time series;

(f) classifying all peaks in said time series into one of a first set consisting of peaks assigned the first state value indicating the empty condition and a second set consisting of peaks assigned the second state value indicating the capture condition;

(g) recursively applying steps (a) through (f) to one of the first set and the second set.

12. The method of claim 11, wherein said determining a peak at step (c) comprises:
for each said trap, calculating a difference in position between corresponding peaks in said first set and said second set to determine said amplitude;
calculating a first sum based on intensities of the peaks of said first set;
calculating a second sum based on intensities of the peaks of said second set; and
for each said trap, calculating a ratio of said first and second sums to determine said time constant ratio.

13. The method of claim 11, wherein said assigning a peak index value further comprises:
creating a look-up table defining a number of allowed next-state transitions from each said state, wherein each said allowed next-state transition is a transition to a state that differs from a current state by 1 binary digit; and wherein said allowed next-state transitions exclude transitions to any state other than one of said allowed next-state transitions, to prevent state assignment errors caused by Gaussian noise during said assigning a peak index value.

14. The method of claim 10, wherein said assigning a peak index value comprises:
(a) assigning a highest peak index value to one of said states in which all said traps are in a capture condition, wherein each said state is comprised of a first state value indicating the empty trap condition and a second state value indicating the capture condition, wherein a transition from said first state value to said second state value represents capture of an electron by an associated trap, and a transition from said second state value to said first state value represents release of an electron from the associated trap, and wherein the drain current of said semiconductor device changes between at least two stable states in response to said transitions;
(b) assigning the second state value indicating the capture condition to a highest peak other than the highest peak associated with step (a) or the next highest peak with respect thereto;
(c) determining a peak which is nearest in time to a time position in which the peak value is the highest peak in step (b) plus an offset value;
(d) assigning the first state value indicating the empty condition to the peak determined in step (c);
(e) repeating steps (b) through (d) for all peaks in said time series;
(f) classifying all peaks in said time series into one of a first set consisting of peaks assigned the first state value indicating the empty condition and a second set consisting of peaks assigned the second state value indicating the capture condition;
(g) recursively applying steps (a) through (f) to one of the first set and the second set.

15. The method of claim 14, wherein said determining a peak at step (c) comprises:
for each said trap, calculating a difference in position between corresponding peaks in said first set and said second set to determine said amplitude;
calculating a first sum based on intensities of the peaks of said first set;
calculating a second sum based on intensities of the peaks of said second set; and
for each said trap, calculating a ratio of said first and second sums to determine said time constant ratio.

16. The method of claim 14, wherein said assigning a peak index value further comprises:
creating a look-up table defining a number of allowed next-state transitions from each said state, wherein each said allowed next-state transition is a transition to a state that differs from a current state by 1 binary digit; and
wherein said allowed next-state transitions exclude transitions to any state other than one of said allowed next-state transitions, to prevent state assignment errors caused by Gaussian noise during said assigning a peak index value.

17. The method of claim 8, wherein said uniquely assigning each said data point is performed based on a dynamic threshold that is different from an equilibrium threshold.

18. The method of claim 8, wherein the number of said defects is three or more.

19. An apparatus for extracting characteristic physical constants from a complex Random Telegraph Noise (RTN) signal, the apparatus comprising:
a first stage configured to resolve a number of stable states in a time series, said stable states being associated with a plurality of defects, said time series comprising a plurality of data points, and to determine an activation status of each said defect; and
a second stage configured to calculate a transition preference table based on physically allowed transitions, and to uniquely assign each said data point of said time series to one said stable state using said transition preference table,
wherein each said defect comprises a bistable trap of a mobile charge carrier in said semiconductor device, and
wherein said plurality of defects causes Random Telegraph Noise (RTN) in a voltage threshold of one or more gates of said semiconductor device.

20. The apparatus of claim 19, wherein said first stage is further configured to:
assign a peak index value for each of a plurality of peaks of said time series, each said peak being associated with one said defect;
calculate an amplitude and a time constant ratio for each said defect;
determine a theoretical intensity for each said peak; and
determine a number of said defects based on a correspondence between said calculated amplitude and time constant ratio for each said peak and said theoretical intensity for each peak associated with each said defect,
wherein said first stage assigns a peak index value for each of a plurality of peaks using a standard deviation based on physical characteristics of a measuring system.

* * * * *